United States Patent
Leverrier et al.

(10) Patent No.: US 9,463,974 B2
(45) Date of Patent: Oct. 11, 2016

(54) MICRO-ELECTRO-MECHANICAL SYSTEMS (MEMS)

(75) Inventors: Bertrand Leverrier, Montelier (FR); Olivier Lefort, Valence (FR); Andre Boura, Chatellerault (FR); Bernard Chaumet, Chatellerault (FR)

(73) Assignee: Thales, Courbevoie (FR)

( * ) Notice: Subject to any disclaimer, the term of this patent is extended or adjusted under 35 U.S.C. 154(b) by 934 days.

(21) Appl. No.: 13/282,774

(22) Filed: Oct. 27, 2011

(65) Prior Publication Data

US 2012/0274176 A1   Nov. 1, 2012

(30) Foreign Application Priority Data

Oct. 29, 2010   (FR) ...................................... 10 04273

(51) Int. Cl.
*H02N 1/00* (2006.01)
*B81B 7/00* (2006.01)
*G01C 19/5719* (2012.01)

(52) U.S. Cl.
CPC ......... *B81B 7/0048* (2013.01); *G01C 19/5719* (2013.01); *B81B 2201/0235* (2013.01); *B81B 2201/0242* (2013.01); *B81B 2203/0109* (2013.01)

(58) Field of Classification Search
CPC ........................................................ H02N 1/00
USPC ............ 310/12.03, 300, 309, 330, 329, 331
See application file for complete search history.

(56) References Cited

U.S. PATENT DOCUMENTS

| 5,203,208 | A | 4/1993 | Bernstein |
| 6,230,567 | B1 | 5/2001 | Greiff |
| 6,713,938 | B2 * | 3/2004 | Nguyen ........................ 310/309 |
| 7,671,710 | B2 * | 3/2010 | Yoshida et al. ................... 334/6 |
| 7,923,895 | B2 * | 4/2011 | Chiang et al. ................ 310/311 |
| 8,164,232 | B2 * | 4/2012 | Kornbluh et al. ............ 310/309 |
| 8,665,041 | B2 * | 3/2014 | Christenson .................... 335/78 |
| 2004/0187578 | A1 | 9/2004 | Malametz |
| 2007/0024156 | A1 * | 2/2007 | Li et al. ......................... 310/309 |
| 2008/0017489 | A1 * | 1/2008 | Kawakubo et al. .......... 200/181 |
| 2008/0116765 | A1 * | 5/2008 | Sugiura et al. ............... 310/334 |
| 2008/0204153 | A1 * | 8/2008 | Yoshida et al. ................. 331/66 |
| 2009/0322260 | A1 * | 12/2009 | Lee ....................... B81B 3/0021 318/116 |
| 2010/0171577 | A1 * | 7/2010 | Christenson ................. 335/180 |
| 2011/0074247 | A1 * | 3/2011 | Hohlfeld ............... B81B 3/0051 310/329 |
| 2012/0013392 | A1 * | 1/2012 | Rothberg et al. ............. 327/509 |
| 2012/0194207 | A1 * | 8/2012 | Vaganov et al. .......... 324/750.01 |

FOREIGN PATENT DOCUMENTS

| GB | 2444373 | 6/2008 |
| WO | 02093180 | 11/2002 |
| WO | 03054477 | 7/2003 |
| WO | 2011000644 | 1/2011 |

* cited by examiner

*Primary Examiner* — Naishadh Desai

(74) *Attorney, Agent, or Firm* — Michael J. Donohue; Davis Wright Tremaine LLP

(57) ABSTRACT

The micro-electro-mechanical system is provided with at least two separate anchoring elements (F1, F2) designed to be bound to a support. A anchoring element (F1, F2) is solidly linked to at least one beam (P1, P2) that can be deformed in bending, and two beams (P1, P2) respectively linked to two distinct anchoring elements (F1, F2) have different directions. A beam has a length L, a thickness e, and a height h, such that the stiffnesses KL in the directions of the length and of the height Kh are large and the stiffness in the direction of the thickness Ke is small.

15 Claims, 4 Drawing Sheets

MICRO-ELECTRO-MECHANICAL SYSTEMS (MEMS)

This application is the United States National Phase of French Patent Application No. N 1004273, filed Oct. 29, 2010.

The present invention relates to a micro-electro-mechanical system (MEMS) provided with at least two anchoring elements designed to be bound to a support, for example a case that may be closed under vacuum.

A micro-electro-mechanical system is a microsystem comprising one or more mechanical elements which use electricity as energy source, in order to produce a sensor and/or actuator function with at least one structure having micrometric dimensions, and the system function of which is partly provided by the form of this structure. The term micro-electro-mechanical system is referred to by the acronym MEMS. Hereinafter in the description, the acronym MEMS will be employed as a synonym for micro-electro-mechanical system.

The micro-electro-mechanical systems are microstructures obtained by etching one or more substrates, whose dimensions are such that it comprises several tens to several hundreds of micro-electro-mechanical systems. The packaging includes the means and functions used to manipulate these micro-electro-mechanical systems, during integration in the products, without risk of degradation to the micro-electro-mechanical systems. For example, it is important to correctly manage the electrical connections of the micro-electro-mechanical systems with electronic control cards.

The packaging functions also have a key role in limiting the impact of the external environment on sensitive areas that are the micro-electro-mechanical systems.

In fact, the causes of performance degradations in micro-electro-mechanical systems can be varied, such as:
- mechanical stresses linked to the differences in expansion coefficient between the materials of the host structure and the materials of the micro-electro-mechanical system;
- variations of the pressure around the micro-electro-mechanical systems;
- stray capacitances that are variable under the effect of humidity; and
- excessive stresses generated by impacts on the active structure.

The packaging also has to control the relative position of the detector or micro-electro-mechanical system relative to its support.

It is known practice to use gluing or brazing technologies to fix the micro-electro-mechanical systems on a support. A gluing or a brazing is performed over all or part of one of the faces of the structure, by using, for example, so-called silicone-based flexible glues, or so-called hard brazings based on a gold/tin mixture.

However, the known systems are limited in terms of anchoring and alignment stiffnesses between the detector and its support, of compatibility with a vacuum sealing of the detector in a case, and of preservation of the performance characteristics of the micro-electro-mechanical system.

One aim of the invention is to overcome the above problems.

There is proposed, according to one aspect of the invention, a micro-electro-mechanical system provided with at least two separate anchoring elements designed to be bound to a support, in which a anchoring element is solidly linked to at least one beam that can be deformed in bending. Two beams respectively linked to two distinct anchoring elements have different directions. A beam has a length L, a thickness e, and a height h, such that the stiffnesses KL in the directions of the length and of the height Kh are large and the stiffness in the direction of the thickness Ke is small.

Thus, even if the support is deformed, these deformations are not transmitted to the micro-electro-mechanical system, unlike in the configurations of the prior art such that the anchoring by gluing or brazing on more or less large surface areas of the micro-electro-mechanical system which always generates large stresses and deformations of the internal structure of the micro-electro-mechanical system. With the configuration described, the anchoring system avoids the transmission of the stresses and external deformations while ensuring a rigid anchoring of the microsystem characterized by significant stiffnesses in translation along all the axes and in rotation around all the axes.

The support may be a case, making it possible, for example, to vacuum-seal the detector or micro-electro-mechanical system. In fact, to ensure the operation of MEMS detectors, notably resonant, such as inertial sensors of rate gyro or accelerometer types, it is essential for them to be in a chamber under a more or less high vacuum, in order to allow for the correct operation of the MEMS detector implemented, to be able to have a maximum sensitivity of the MEMS detector. Thus, it is commonplace for a pressure less than $10^{-2}$ hPa to be necessary for the correct operation of such a detector. Such detectors are therefore encapsulated in a hermetic chamber, within which the required vacuum or a reduced pressure atmosphere has been produced. It is, however, difficult to obtain a good quality vacuum level, or, in other words, a low pressure, typically a pressure less than $10^{-2}$ hPa inside the case of a MEMS detector build on silicon.

Furthermore, the overall stiffness of the anchoring system is great in all the directions in translation and in rotation.

For example, two beams respectively linked to two distinct anchoring elements have substantially orthogonal directions.

By having orthogonal directions, it becomes possible to maximize the overall stiffness of the suspended part.

For example, the micro-electro-mechanical system comprises three anchoring elements.

Using three anchoring elements makes it possible to further increase the anchoring stiffness of the suspended part, particularly in rotation about the center of gravity.

The beam or beams linked to two of the three anchoring elements can then have a substantially identical direction, and the beam or beams linked to the other of the three anchoring elements have a direction substantially orthogonal to the direction of said other beam or beams.

Such an embodiment makes it possible to maximize the stiffness imparted by the system of beams.

For example, the micro-electro-mechanical system comprises four anchoring elements.

Using four anchoring elements makes it possible to construct a structure with a high degree of symmetry. It is particularly favorable if the micro-electro-mechanical system operates with differential structures whose properties are preserved.

The beam or beams linked to two of the four anchoring elements can then have a substantially identical direction, and the beam or beams linked to the other two of the four anchoring elements have a direction substantially orthogonal to the direction of said other beam or beams.

Such an embodiment makes it possible to maximize the stiffness imparted by the system of beams.

For example, the beams solidly linked to one and the same anchoring element have substantially the same direction.

This makes it possible to double the overall stiffness of the system uniformly in all directions.

A anchoring element can be solidly linked to four beams.

This makes it possible, by multiplying the number of beams, to optimize the ratio between the stiffness in the axis parallel to the long length of the beams and the stiffnesses along the axes perpendicular to this length.

According to one embodiment, said micro-electro-mechanical system being made of a multilayer material comprising at least one active layer and two protection layers on either side on the active layer, said beams are produced in one of the two protection layers.

In such an embodiment, the beam system is produced in the same material as the rest of the microsystem, and the homogeneous nature of the microsystem is preserved. The manufacturing is also done collectively before or after the assembly of the protection layer.

According to another aspect of the invention, there is also proposed a method for anchoring a micro-electro-mechanical system on a support, by linking at least two anchoring elements separate from the micro-electro-mechanical system, by solidly linking an anchoring element to at least one beam that can be deformed in bending, two beams respectively linked to two distinct anchoring elements having different directions, a beam having a length L, a thickness e, and a height h, such that the stiffnesses KL in the directions of the length and of the height Kh are large and the stiffness in the direction of the thickness Ke is small.

For example, said link is made by brazing and/or soldering and/or gluing.

The invention will be better understood on studying a few embodiments described as nonlimiting examples and illustrated by the appended drawings in which:

FIGS. 1a, 1b and 1c schematically illustrate micro-electro-mechanical system embodiments provided with two anchoring elements, according to one aspect of the invention;

FIGS. 2a, 2b, 2c and 2d schematically illustrate micro-electro-mechanical system embodiments provided with three anchoring elements, according to one aspect of the invention; and FIGS. 3a and 3b schematically illustrate micro-electro-mechanical system embodiments provided with four anchoring elements, according to one aspect of the invention.

In all the figures, the elements that have the same references are similar, and the orientation axes are similar.

A anchoring system can be characterized by the overall anchoring stiffness of the microsystem according to three translational movements on the X, Y and Z axes and three rotational movements around these three axes. The anchoring system will be "ideal" if the six stiffness terms have a high value and if, at the same time, the local displacements of the anchoring areas generate little or no deformations of the microsystem. The different figures below present a number of configurations with different degrees of stiffness.

FIG. 1a represents a micro-electro-mechanical system provided with two anchoring elements F1 and F2, designed to be bound to a support, for example an encapsulation case, by means of the two anchoring elements F1 and F2. Each anchoring element F1 and F2 is respectively solidly linked to a beam P1 and P2 that can be deformed in bending.

Conventionally, a beam, or decoupling arm is defined as a parallelepipedal mechanical part: with a large dimension or length L and two small dimensions, a thickness e and a height h. The dimensions L, e, and h are such that the stiffnesses KL and Kh respectively in the directions of the length and of the height are large and the stiffness in the direction of the thickness Ke is small. In the figures, the height h is along the Z axis and the length L and thickness e are in the plane XY.

Hereinafter in the description, typical values for a beam are: L/e>20, and h/e>6, and typical stiffness values KL, Ke and Kh, respectively along the dimensions L, e and h such that: Kh/Ke is of the order $(h/e)^2$ which is approximately 36, and KL/Ke is of the order of $(L/e)^2$ which is approximately 400.

Furthermore, for an association of two identical beams arranged in parallel, for a given thickness e, the stiffnesses, KL, Ke and Kh respectively have a doubled value.

By comparison, doubling the thickness e of a beam would multiply by two its stiffnesses KL and Kh, but its stiffness Ke would be multiplied by eight. Given the footprint or given a beam stiffness, in the direction of the thickness e, it is therefore better to multiple the number of beams as long as the dimension e is achievable.

FIG. 1a shows two beams P1 and P2, forming part of the microsystem, arranged in parallel, considering the directions of their lengths, linking the main part of the detector to the two anchoring elements F1 and F2 of the detector.

Such an embodiment provides a significant overall stiffness in the Y direction, a moderate stiffness in the Z direction, but a rather small stiffness along the X axis. This configuration is, however, very tolerant on the displacements of the anchoring areas along the three axes and even in rotation.

Figure 1A:
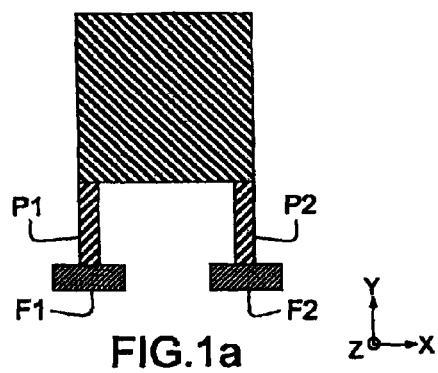
FIG. 1b represents a variant of the embodiment of FIG. 1a, in which the two beams P1 and P2 have different respective directions, which makes it possible to greatly increase the stiffness in the X direction by also increasing the stiffness in the Z direction.
FIG. 1c represents a variant of the embodiments of FIGS. 1a and 1b, in which the two beams P1 and P2 have orthogonal respective directions, which makes it possible to optimize the translational stiffness along the three axes X, Y and Z for a system with two beams. The embodiments of FIGS. 1b and 1c are still rather little sensitive to the displacements of the anchoring areas along the Z axis.
Figure 1B:
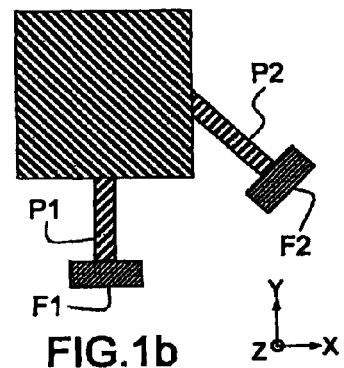
Figure 1C:
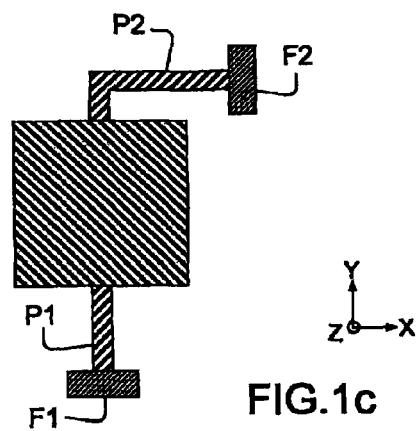
Figure 2A:
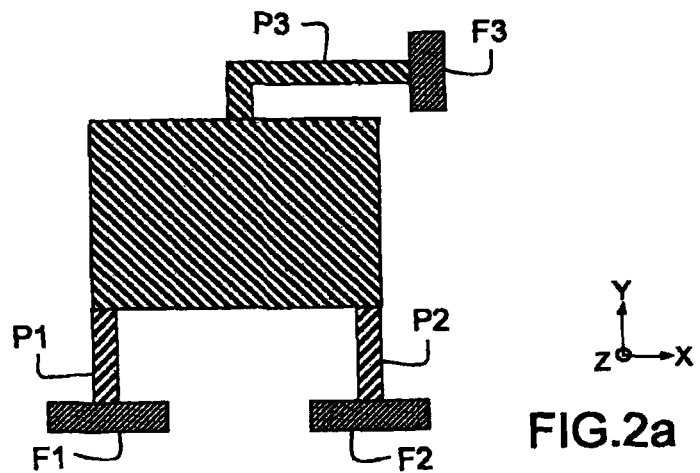

FIG. 2a represents a micro-electro-mechanical system whose main part is of rectangular shape, provided with three anchoring elements F1, F2 and F3, designed to be bound to a support, for example an encapsulation case, by means of the three anchoring elements F1, F2 and F3. Each anchoring element F1, F2 and F3 is respectively solidly linked to a beam P1, P2 and P3 which can be deformed in bending, linking the main part of the detector to the three anchoring elements F1, F2 and F3 of the detector.

The two beams P1 and P2 have a substantially identical direction, and are linked to one and the same edge of the main part of the detector, whereas the third beam P3 has a direction substantially orthogonal to the direction of the other two beams P1 and P2, and it is linked to the opposite edge of the main part of the detector. Compared to the structure with two beams, such an embodiment makes it possible to have a significant rotational stiffness around the three axes while keeping a significant translational stiffness also along the three axes. This configuration becomes slightly sensitive to the displacements of the anchoring areas along the Z axis.

Figure 2B:
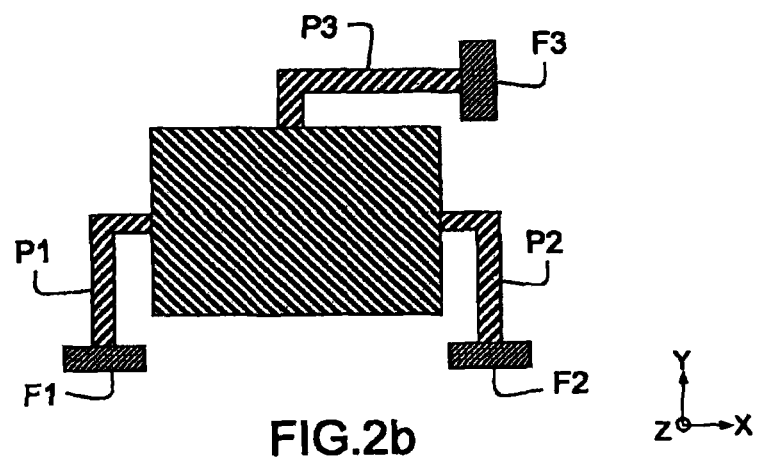

FIG. 2b represents a variant of the embodiment of FIG. 2a, in which the two beams P1 and P2 have a substantially identical direction, and are respectively linked to the edges of the main part of the detector, adjacent to the edge to which the third beam P3 is bound, which reduces the rotational lever arm along X and produces a higher resonance mode in this direction.

Figure 2C:
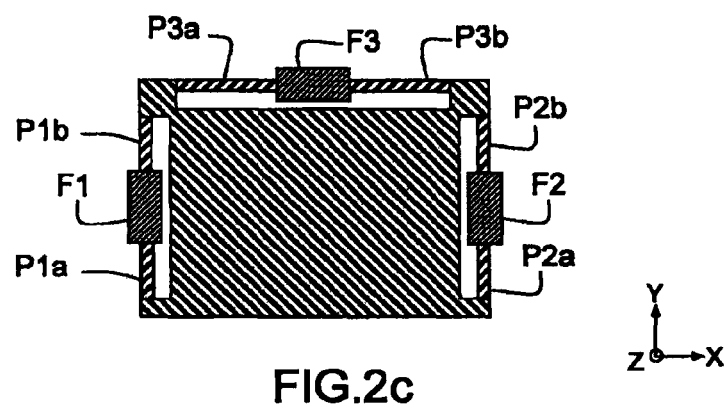

FIG. 2c represents a variant of FIGS. 2a and 2b of a micro-electro-mechanical system whose main part is of substantially rectangular form, provided with three anchoring elements F1, F2 and F3, designed to be bound to a support, for example an encapsulation case, by means of the three anchoring elements F1, F2 and F3. Each anchoring element F1, F2 and F3 is respectively solidly linked to two beams with the same direction, which can be deformed in bending, linking the main part of the detector to the three anchoring elements F1, F2 and F3 of the detector.

The anchoring element F1 is solidly linked to two beams P1a and P1b, the anchoring element F2 is solidly linked to two beams P2a and P2b and the anchoring element F3 is solidly linked to two beams P3a and P3b. The four beams P1a, P1b, P2a, P2b have a substantially identical direction, whereas the two beams P3a and P3b have a direction substantially orthogonal to the direction of the other four beams P1a, P1b, P2a and P2b. Such an embodiment makes it possible to further increase the rotational stiffnesses on the X and Y axes.

Figure 2D:
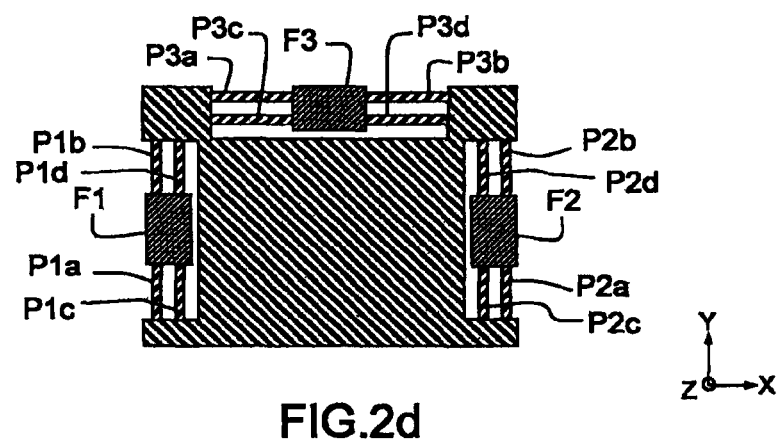

FIG. 2d is a variant of FIG. 2c, in which each beam of FIG. 2c is duplicated as two parallel beams. Also, a micro-electro-mechanical system whose main part is of substantially rectangular shape, provided with three anchoring elements F1, F2 and F3, designed to be bound to a support, for example an encapsulation case, by means of the three anchoring elements F1, F2 and F3. Each anchoring element F1, F2 and F3 is respectively solidly linked to two beams with the same direction, which can be deformed in bending, linking the main part of the detector to the three anchoring elements F1, F2 and F3 of the detector.

The anchoring element F1 is solidly linked to four beams P1a, P1b, P1c and P1d, the anchoring element F2 is solidly linked to four beams P2a, P2b, P2c and P2d, and the anchoring element F3 is solidly linked to four beams P3a, P3b, P3c and P3d. The eight beams P1a, P1b, P1c, P1d, P2a, P2b, P2c and P2d have a substantially identical direction, whereas the four beams P3a, P3b, P3c and P3d have a direction substantially orthogonal to the direction of the other eight beams P1a, P1b, P1c, P1d, P2a, P2b, P2c and P2d. Such an embodiment makes it possible, by multiplying the number of beams, for a given stiffness on the X, Y and Z axes, to have local stiffnesses four times smaller, at the level of the anchoring elements, for the movements along the thickness e of each beam.

Figure 3A:
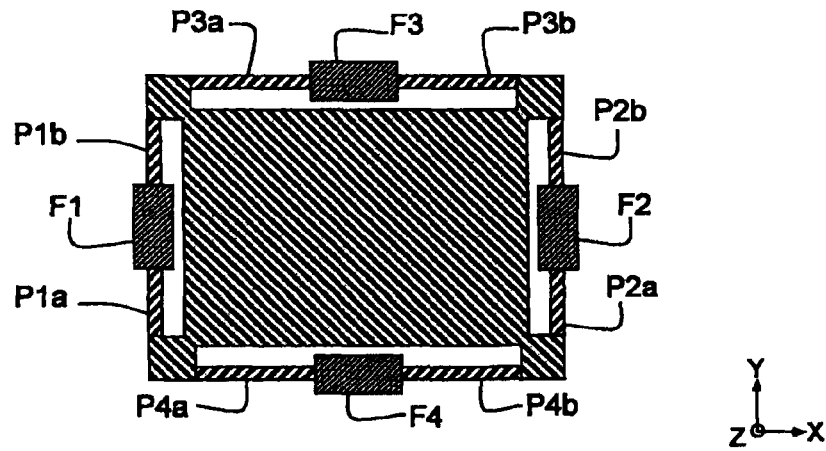

FIG. 3a represents a micro-electro-mechanical system whose main part is of rectangular shape, provided with four anchoring elements F1, F2, F3 and F4, designed to be bound to a support, for example an encapsulation case, by means of the four anchoring elements F1, F2, F3 and F4. Each anchoring element F1, F2, F3 and F4 is respectively solidly linked to two beams which can be deformed in bending, linking the main part of the detector to the four anchoring elements F1, F2, F3 and F4 of the detector.

The anchoring element F1 is solidly linked to two beams P1a and P1b, the anchoring element F2 is solidly linked to two beams P2a and P2b, the anchoring element F3 is solidly linked to two beams P3a and P3b, and the anchoring element F4 is solidly linked to two beams P4a and P4b. The four beams P1a, P1b, P2a and P2b have a substantially identical direction, and the four beams P3a, P3b, P4a and P4b have a direction substantially orthogonal to the direction of the other four beams P1a, P1b, P2a and P2b. Such an embodiment makes it possible to construct a structure that is entirely symmetrical relative to the planes X, Y and relative to the Z axis. This is particularly favorable if the internal structure of the microsystem also has these axes of symmetry, to preserve the rejection of the external deformations.

Figure 3B:
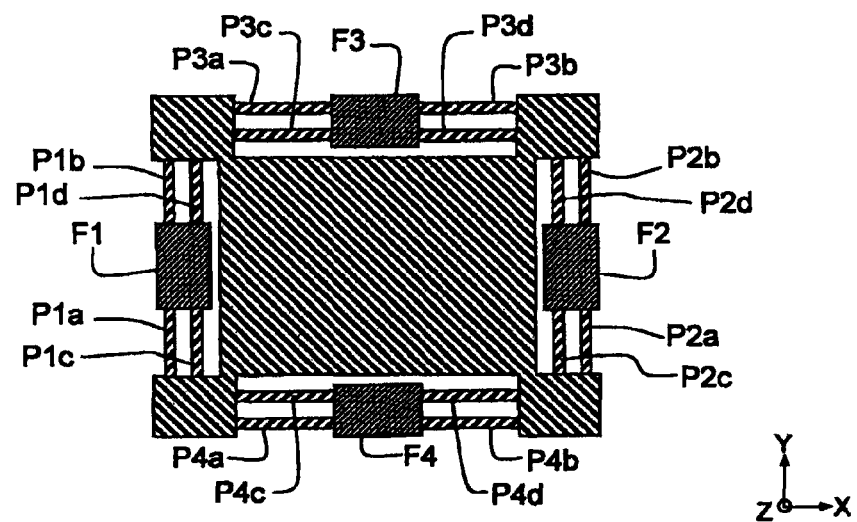

FIG. 3b is a variant of FIG. 3a, in which each beam of FIG. 3b is duplicated as four parallel beams. Also, a micro-electro-mechanical system whose main part is of substantially rectangular shape, provided with four anchoring elements F1, F2, F3 and F4, designed to be bound to a support, for example an encapsulation case, by means of the four anchoring elements F1, F2, F3 and F4. Each anchoring element F1, F2, F3 and F4 is respectively solidly linked to four beams of the same direction, which can be deformed in bending, linking the main part of the detector to the four anchoring elements F1, F2, F3 and F4 of the detector.

The anchoring element F1 is solidly linked to four beams P1a, P1b, P1c and P1d, the anchoring element F2 is solidly linked to four beams P2a, P2b, P2c and P2d, the anchoring element F3 is solidly linked to four beams P3a, P3b, P3c and P3d, and the anchoring element F3 is solidly linked to four beams P4a, P4b, P4c and P4d. The eight beams P1a, P1b, P1c, P1d, P2a, P2b, P2c and P2d have a substantially identical direction, and the other eight beams P3a, P3b, P3c, P3d, P4a, P4b, P4c and P4d have a direction orthogonal to the direction of the other eight beams P1a, P1b, P1c, P1d, P2a, P2b, P2c and P2d. Such an embodiment makes it possible, as for the configuration of FIG. 2d, by multiplying the number of beams, for a given stiffness along the X, Y and Z axes, to have local stiffnesses four times smaller, at the level of the anchoring elements for the movements along the thickness e of each beam.

In the various embodiments, the anchoring elements make it possible to absorb the expansions of the support to which the anchoring elements are bound, notably when the support undergoes expansions due to the temperature effect; since the beams are relatively flexible, the force transmitted to the main part of the detector is thus greatly limited.

Furthermore, when vibrations or accelerations are applied to the anchoring elements or mounting areas, for example horizontally in FIGS. 3a and 3b, the vertical beams work in bending mode and are therefore always flexible. However, the horizontal beams work in traction mode, with a much greater stiffness (of the order of 100 times greater with the embodiments of FIGS. 3a and 3b). The movement of the suspended part is therefore very limited.

Since the beams exhibit an overall large stiffness with respect to the movements of the main part of the detector in translation and in rotation, the resonance modes of this structure remain very high, typically above 20 kHz, whereas they would be of the order of 2 kHz with a more conventional architecture, which makes it possible to control the performance levels in the operational environments. The vibration levels are generally much higher in the low frequencies than in the high frequencies.

According to one aspect of the invention, it is advantageous, when the micro-electro-mechanical system is made of a multilayer material, to produce the beams directly in a protection layer of the multilayer material.

The protection layers are the layers intended to support the active structure of the detector and to protect the active structure of the detector from dust and impacts. It is possible to use gluing or brazing technologies to fix the micro-electro-mechanical system to its support. That can be applied to all the embodiments according to one aspect of the invention.

The beams have a controlled flexibility with respect to the relative displacements of the micro-electro-mechanical system and of the support, which may be a case. They are designed to be very flexible for local displacements of the anchorages or anchorings on the support because they are deformable by bending. However, their combination makes it possible to produce a very stiff anchoring of the detector on its support. Even if the coefficients of thermal expansion are different between the support and the structure of the micro-electro-mechanical system, none or very little of the displacement between the anchoring elements and the support will be transmitted to the mobile elements of the detector.

The detector is said to be suspended relative to the host support, because the only points of contact are, here, the mounting or anchoring areas.

Such a configuration makes it possible, with only three layers, to simultaneously produce a hermetic cavity containing the active structure, and the anchoring system based on flexible beams which is not possible with the state of the prior art which uses at least four layers.

The production of the flexible beams in the same layer as the cap or protective layer simplifies the manufacturing operations by reducing the number of layers to be assembled.

This beam configuration allows for a very rigid anchoring of the structure which is particularly important when constructing rate gyro microstructures to preserve the properties of the resonators produced using mobile internal parts.

The invention claimed is:

1. A micro-electro-mechanical system provided with at least two separate anchoring elements (F1, or F2) designed to be bound to a support, characterized in that each beam (P1, or P2) that can be deformed in bending, is directly connected on both sides, one beam side connected to a respective one of the anchoring elements (F1, or F2) and the other side connected to an internal suspended area of the micro-electro-mechanical system, and in that the two beams (P1, P2) respectively connected to two distinct anchoring elements (F1, F2) have different directions with respect to each other, a beam having a length L, a thickness e, and a height h, such that L/e>20 and h/e>6, such that the stiffnesses KL in the directions of the length and of the height Kh are large and the stiffness in the direction of the thickness Ke is small with the stiffness Kh/Ke being on the order of $(h/e)^2$ and Kl/Ke being on the order of $(L/e)^2$.

2. The micro-electro-mechanical system as claimed in claim 1, in which two beams (P1, P2) respectively linked to two separate anchoring elements (F1, F2) have substantially orthogonal directions with respect to each other.

3. The micro-electro-mechanical system as claimed in claim 1, comprising three anchoring elements (F1, F2, F3).

4. The micro-electro-mechanical system as claimed in claim 3, in which the beam or beams (P1, P2) linked to two (F1, F2) of the three anchoring elements (F1, F2, F3) have a substantially identical direction with respect to each other, and the beam or beams (P3) linked to the other (F3) of the three anchoring elements (F1, F2, F3) have a direction substantially orthogonal to the direction of said other beam or beams (P1, P2).

5. The micro-electro-mechanical system as claimed in claim 1, comprising four anchoring elements (F1, F2, F3, F4).

6. The micro-electro-mechanical system as claimed in claim 5, in which the beam or beams (P1a, P1b, P2a, P2b) linked to two (F1, F2) of the four anchoring elements (F1, F2, F3, F4) have a substantially identical direction with respect to each other, and the beam or beams (P3a, P3b, P4a, P4b) linked to the other two (F3, F4) of the four anchoring elements (F1, F2, F3, F4) have a direction substantially orthogonal to the direction of said other beam or beams (P1a, P1b, P2a, P2b).

7. The micro-electro-mechanical system as claimed in claim 1, in which beams solidly linked to one and the same anchoring elements have substantially the same direction with respect to each other.

8. The micro-electro-mechanical system as claimed in claim 1, in which an anchoring element is solidly linked to four beams.

9. The micro-electro-mechanical system as claimed in claim 1, in which, said micro-electro-mechanical system being made of a multilayer material comprising at least one active layer and two protection layers on either side of the active layer, said beams are produced in one of the two protection layers.

10. The micro-electro-mechanical system as claimed in claim 3, in which beams solidly linked to one and the same anchoring elements have substantially the same direction with respect to each other.

11. The micro-electro-mechanical system as claimed in claim 3, in which an anchoring element is solidly linked to four beams.

12. The micro-electro-mechanical system as claimed in claim 3, in which, said micro-electro-mechanical system being made of a multilayer material comprising at least one active layer and two protection layers on either side of the active layer, said beams are produced in one of the two protection layers.

13. The micro-electro-mechanical system as claimed in claim 5, in which beams solidly linked to one and the same anchoring elements have substantially the same direction with respect to each other.

14. The micro-electro-mechanical system as claimed in claim 5, in which an anchoring element is solidly linked to four beams.

15. The micro-electro-mechanical system as claimed in claim 5, in which, said micro-electro-mechanical system being made of a multilayer material comprising at least one active layer and two protection layers on either side of the active layer, said beams are produced in one of the two protection layers.

* * * * *